(12) United States Patent
Hashimoto

(10) Patent No.: US 10,026,502 B2
(45) Date of Patent: Jul. 17, 2018

(54) METHOD AND MEMORY CONTROLLER

(71) Applicant: FUJITSU LIMITED, Kawaski-shi, Kanagawa (JP)

(72) Inventor: Michitaka Hashimoto, Kawaski (JP)

(73) Assignee: FUJITSU LIMITED, Kawasaki (JP)

( * ) Notice: Subject to any disclaimer, the term of this patent is extended or adjusted under 35 U.S.C. 154(b) by 11 days.

(21) Appl. No.: 15/201,723

(22) Filed: Jul. 5, 2016

(65) Prior Publication Data
US 2017/0053713 A1    Feb. 23, 2017

(30) Foreign Application Priority Data
Aug. 19, 2015   (JP) .................................. 2015-161817

(51) Int. Cl.
| | |
|---|---|
| *G11C 29/00* | (2006.01) |
| *G11C 29/38* | (2006.01) |
| *G11C 29/44* | (2006.01) |
| *G11C 29/02* | (2006.01) |
| *G11C 29/12* | (2006.01) |
| *G11C 29/50* | (2006.01) |
| *G11C 29/36* | (2006.01) |
| *G11C 11/401* | (2006.01) |

(52) U.S. Cl.
CPC ........... *G11C 29/38* (2013.01); *G11C 29/023* (2013.01); *G11C 29/028* (2013.01); *G11C 29/12015* (2013.01); *G11C 29/44* (2013.01); *G11C 29/50012* (2013.01); *G11C 11/401* (2013.01); *G11C 29/36* (2013.01)

(58) Field of Classification Search
CPC .............. G11C 29/38; G11C 29/50012; G11C 29/12015; G11C 29/028; G11C 29/023; G11C 29/44; G11C 11/401; G11C 29/36
See application file for complete search history.

(56) References Cited

U.S. PATENT DOCUMENTS

| | | | | |
|---|---|---|---|---|
| 5,570,294 A | * | 10/1996 | McMinn | G01R 31/3016 324/527 |
| 5,646,904 A | * | 7/1997 | Ohno | G06F 13/1689 365/194 |
| 6,594,748 B1 | * | 7/2003 | Lin | G06F 13/1689 711/151 |

(Continued)

FOREIGN PATENT DOCUMENTS

| | | |
|---|---|---|
| JP | 5-291901 | 11/1993 |
| JP | 8-008699 | 1/1996 |
| JP | 11-101852 | 4/1999 |

*Primary Examiner* — Thien Nguyen
(74) *Attorney, Agent, or Firm* — Fujitsu Patent Center

(57) ABSTRACT

A method includes setting a first logical value in a control register provided in a variable delay control circuit that is included in a memory controller, detecting a first stuck-at fault of a second logical value that is a value except for the first logical value, the first stuck-at fault having occurred in one of a plurality of control lines, in accordance with a result of a comparison between a logical value output from the memory controller and an expected value of the logical value, setting the second logical value in the memory controller, and detecting a second stuck-at fault of the first logical value, the second stuck-at fault having occurred in one of the plurality of control lines, in accordance with a result of a comparison between a logical value output from the memory controller and an expected value of the logical value.

7 Claims, 10 Drawing Sheets

(56) References Cited

U.S. PATENT DOCUMENTS

| | | | |
|---|---|---|---|
| 9,471,094 B1* | 10/2016 | Brahmadathan | G06F 1/12 |
| 2011/0133786 A1* | 6/2011 | Yamaoka | H03K 19/00346 |
| | | | 327/97 |
| 2016/0124044 A1* | 5/2016 | Nonaka | G01R 31/31852 |
| | | | 714/731 |

* cited by examiner

FIG. 4

<ADJUSTMENT OF DELAY TIME>

| RELATIONSHIP BETWEEN VALUES IN n0 TO n3 AND DELAY UNITS TO BE USED | | | | |
|---|---|---|---|---|
| n0 (C0) | 1 | 0 | 0 | 0 |
| n1 (C1) | 0 | 1 | 0 | 0 |
| n2 (C2) | 0 | 0 | 1 | 0 |
| n3 (C3) | 0 | 0 | 0 | 1 |
| DELAY UNITS TO BE USED | U0 | U0–U1 | U0–U2 | U0–U3 |

<OPERATION TO DETECT STUCK-AT FAULT>

|  | C0 = C1 = C2 = C3 = 0 (ALL 0'S) | | | | C0 = C1 = C2 = C3 = 1 (ALL 1'S) | | | |
|---|---|---|---|---|---|---|---|---|
| n0 (C0) | 0 | (1) | 0 | 0 | 1 | 1 | 1 | 1 |
| n1 (C1) | 0 | 0 | (1) | 0 | 1 | 1 | (0) | 1 |
| n2 (C2) | 0 | 0 | 0 | (1) | 1 | (0) | 1 | 1 |
| n3 (C3) | 0 | 0 | 0 | 0 | 1 | 1 | 1 | (0) |
| R0 | 0 | 1 | 1 | 0 | 0 | 1 | 1 | 0 |
| R1 | 0 | 0 | 1 | 1 | 0 | 0 | 1 | 0 |
| R2 | 0 | 0 | 0 | 1 | 0 | 0 | 0 | 1 |
| [R2:R0] | 0 | 1 | 3 | 6 | 4 | 1 | 3 | 6 | 4 |
| FAIL | 0 | 1 | 1 | 1 | 1 | 1 | 1 | 1 | 1 |

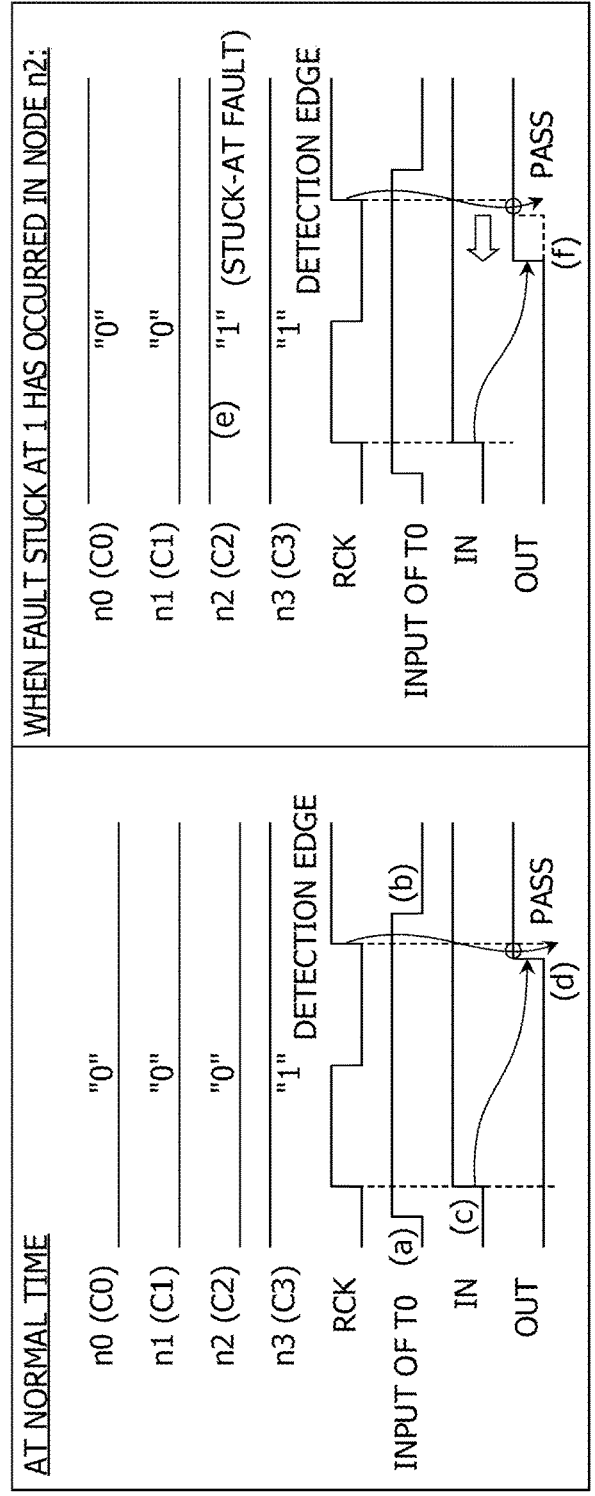

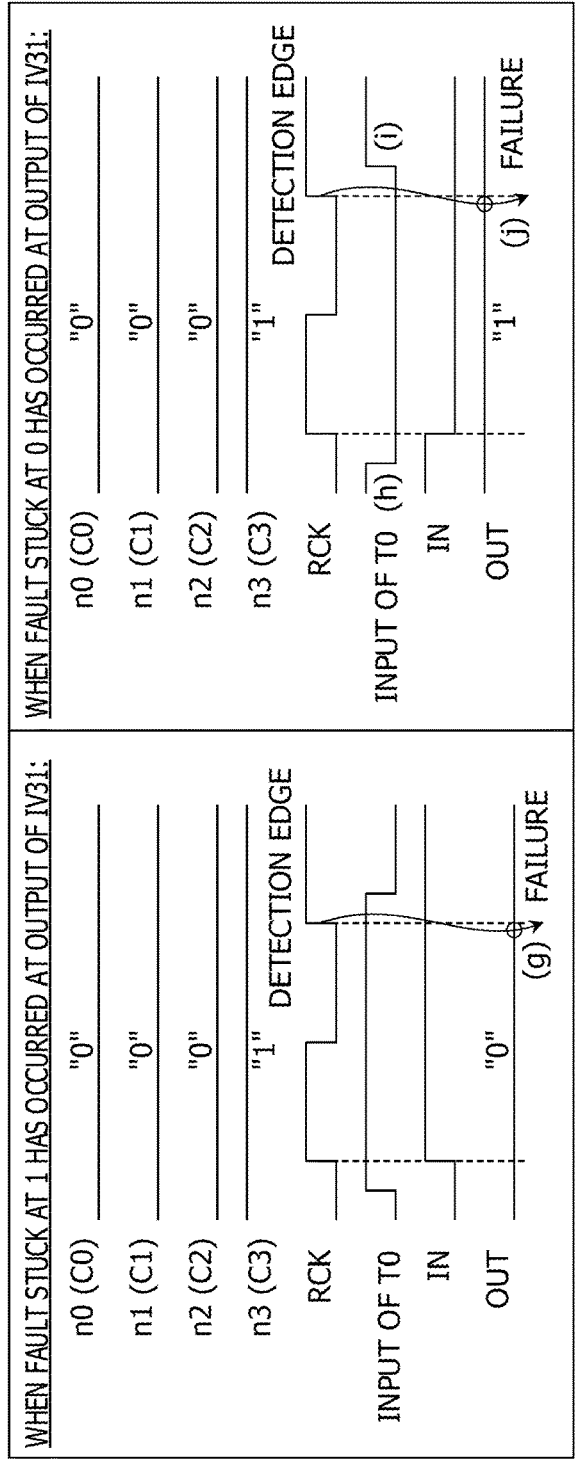

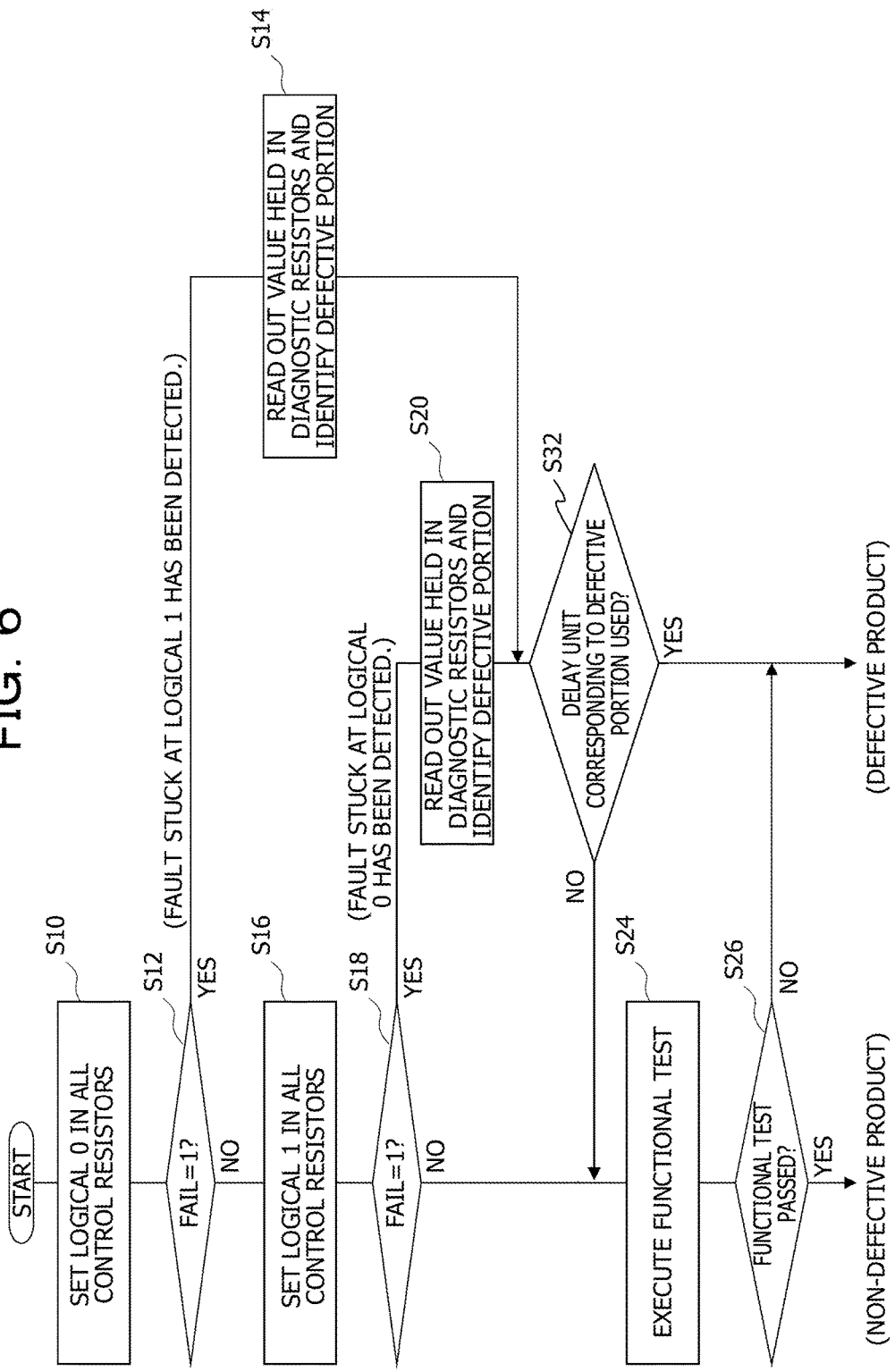

FIG. 9

<ADJUSTMENT OF DELAY TIME>

| RELATIONSHIP BETWEEN VALUES IN n0 TO n3 AND DELAY UNITS TO BE USED | | | | |
|---|---|---|---|---|
| n0 (C0) | 0 | 0 | 0 | 1 |
| n1 (C1) | 0 | 0 | 1 | 0 |
| n2 (C2) | 0 | 1 | 0 | 0 |
| n3 (C3) | 1 | 0 | 0 | 0 |
| DELAY UNITS TO BE USED | U3 | U2-U3 | U1-U3 | U0-U3 |

<OPERATION TO DETECT STUCK-AT FAULT>

| | C0 = C1 = C2 = C3 = 0 (ALL 0'S) | | | | | | | | C0 = C1 = C2 = C3 = 1 (ALL 1'S) | | | | | | | |
|---|---|---|---|---|---|---|---|---|---|---|---|---|---|---|---|---|
| n0 (C0) | 0 | 0 | 0 | 0 | 0 | 0 | 0 | 0 | 1 | 1 | (0) | 1 | 1 | 1 | 1 | 1 |
| n1 (C1) | 0 | 0 | 0 | 0 | (1) | 0 | 0 | 0 | 1 | 1 | 1 | (0) | 1 | 1 | 1 | 1 |
| n2 (C2) | 0 | 0 | 0 | (1) | 0 | 0 | 0 | 0 | 1 | 1 | 1 | 1 | (0) | 1 | 1 | 1 |
| n3 (C3) | 0 | (1) | 0 | 0 | 0 | 0 | 0 | 0 | 1 | 1 | 1 | 1 | 1 | (0) | 1 | 1 |
| R0 | 0 | 1 | 0 | 1 | 1 | 0 | 1 | 0 | 1 | 0 | 1 | 1 | 1 | 1 | 0 | 0 |
| R1 | 0 | 0 | 1 | 1 | 0 | 1 | 0 | 0 | 1 | 1 | 0 | 1 | 0 | 1 | 1 | 0 |
| R2 | 0 | 0 | 0 | 1 | 1 | 1 | 0 | 1 | 1 | 1 | 1 | 0 | 0 | 0 | 1 | 1 |
| [R2:R0] | 0 | 1 | 3 | 6 | 4 | 1 | 1 | 1 | 3 | 6 | 4 | 1 |
| FAIL | 0 | 1 | 1 | 1 | 1 | 1 | 1 | 1 | 1 | 1 | 1 | 1 |

METHOD AND MEMORY CONTROLLER

CROSS-REFERENCE TO RELATED APPLICATION

This application is based upon and claims the benefit of priority of the prior Japanese Patent Application No. 2015-161817, filed on Aug. 19, 2015, the entire contents of which are incorporated herein by reference.

FIELD

The embodiments discussed herein are related to a method and a memory controller.

BACKGROUND

To improve an operation margin in an internal circuit included in a large-scale integration (LSI) chip or another semiconductor device, a timing of an internal signal is adjusted by a variable delay control circuit to change an operation timing of the internal circuit. A test circuit including a control gate and the like is added to this type of variable delay control circuit, and a test signal is given to an input terminal of the variable delay control circuit. By deciding a logical value that appears at an output terminal of the variable delay control circuit when the test signal is given, it is possible to diagnose whether a stuck-at fault is present in the variable delay control circuit. A stuck-at fault is a fault that occurs when a signal line causes a short, a break, or another failure and is stuck at a logical 0 or logical 1.

A clock generating circuit is proposed in which an input clock is given to the first one of four variable delay control circuits coupled in series and four delay clocks output from the four variable delay control circuits are used to create a transition edge of an output clock. In the clock generating circuit, the delay times of the variable delay control circuits are adjusted so that the phase of a delay clock output from the last variable delay control circuit matches the phase of the input clock, so an output clock that has a frequency twice the frequency of the input clock and has a 50% duty cycle is generated. To detect a difference, caused due to manufacturing error or the like, in delay time between variable delay control circuits, a common test signal is supplied to a plurality of variable delay control circuits, which are electrically separated, and the output level of an exclusive logical sum circuit that receives outputs from any two variable delay control circuits is held in a latch.

Japanese Laid-open Patent Publication Nos. 11-101852, 5-291901, and 8-8699 are known as examples of related art.

As the clock frequency of a semiconductor device is increased, the timing margin of an internal signal transmitted in the semiconductor device tends to be reduced. As the structures of transistors and other elements included in a semiconductor device are made to be fine, stuck-at faults caused in a semiconductor device manufacturing process tend to be increased. A stuck-at fault is detected by supplying a test pattern to the semiconductor device and comparing a value output from the semiconductor device with an expected value. However, the more complex the test pattern is, the longer a test time is, increasing the manufacturing cost of the semiconductor device.

SUMMARY

According to an aspect of the invention, a method includes setting a first logical value in a control register provided in a variable delay control circuit that is included in a memory controller, the memory controller including (a) a plurality of delay circuits, (b) a switching circuit that selects a number of delay circuits to be coupled to transmit a data signal, the delay circuits to be coupled being part of the plurality of delay circuits, in accordance with a control signal received through a plurality of control lines, (c) a plurality of exclusive logical sum circuits, each of which calculates an exclusive logical sum of logical values that appears in two control lines of the plurality of control lines, (d) a plurality of diagnostic registers, each of which stores a logical value output from one of the plurality of exclusive logical sum circuits, and (e) a logical sum circuit that calculates a logical sum of logical values output from the plurality of exclusive logical sum circuits, the control register storing the control signal to be set in the plurality of control lines, detecting a first stuck-at fault of a second logical value that is a value except for the first logical value, the first stuck-at fault having occurred in one of the plurality of control lines, in accordance with a result of a comparison between a logical value output from the logical sum circuit and an expected value of the logical value, setting the second logical value in the control register, and detecting a second stuck-at fault of the first logical value, the second stuck-at fault having occurred in one of the plurality of control lines, in accordance with a result of a comparison between a logical value output from the logical sum circuit and an expected value of the logical value.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 4 illustrates an example of the operation of the variable delay control circuit in FIG. 1;

FIGS. 5A to 5D each illustrate an example of a functional test in a case in which delay units are used in the variable delay control circuit in FIG. 1;

FIG. 6 illustrates an example of an operational test for the variable delay control circuit in FIG. 1;

FIG. 9 illustrates an example of the operation of the variable delay control circuit in FIG. 8.

DESCRIPTION OF EMBODIMENTS

In an aspect of an embodiment, an object of a method and a memory controller in this disclosure, the method being a method of diagnosing a stuck-at fault in a variable delay control circuit and the memory controller having the variable delay control circuit, is to diagnose, in a test time shorter than before, whether a stuck-at fault generated in the variable delay control circuit is present.

Embodiments will be described below with reference to the drawings. In the descriptions below, a signal line through which a signal is transmitted and a terminal to which the signal is transmitted will be denoted by a symbol assigned to the signal. A signal suffixed with a sharp # represents a negative logic signal.

Figure 1:
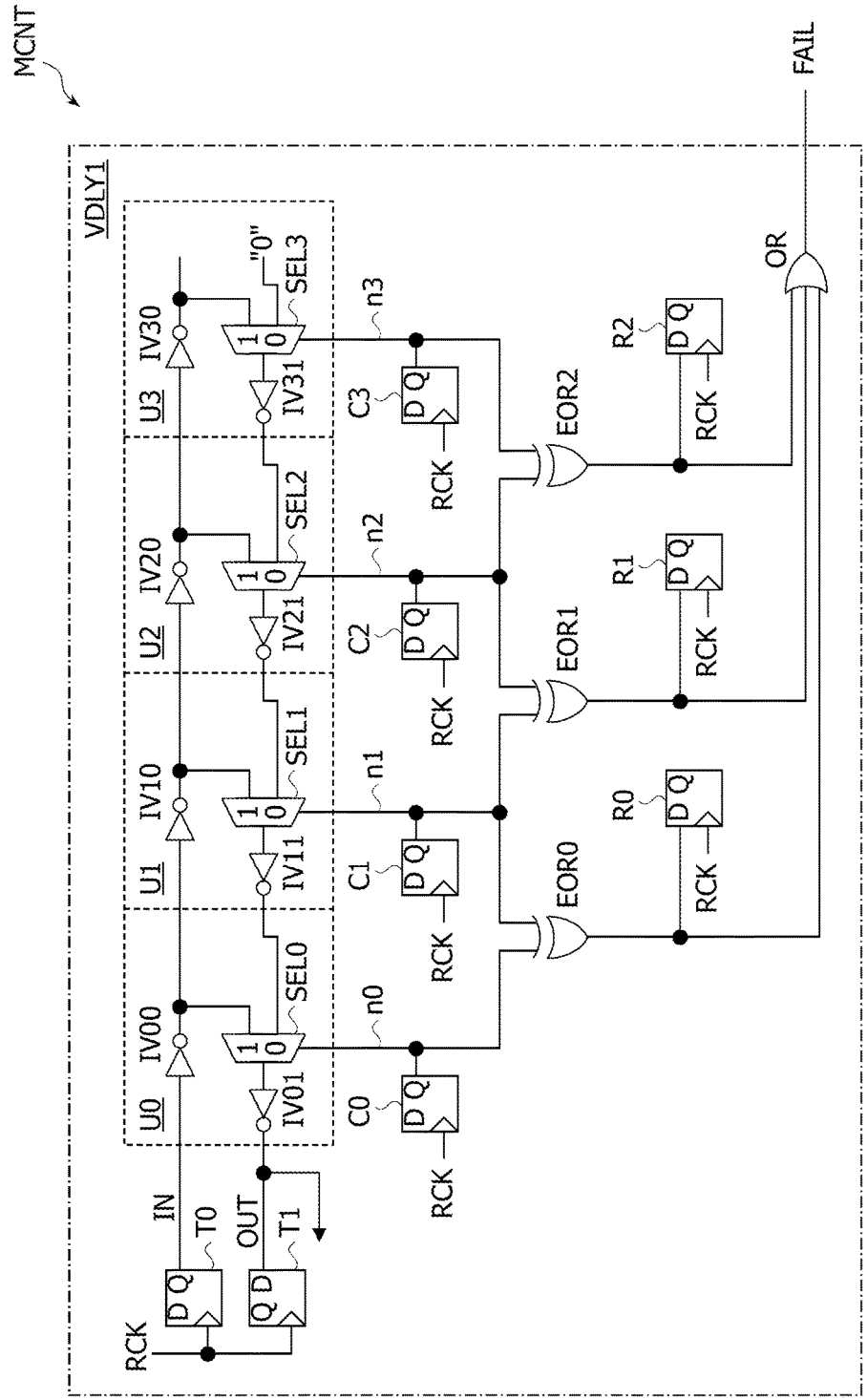
FIG. 1 illustrates an embodiment of a method of diagnosing a stuck-at fault in a variable delay control circuit and a memory controller that has the variable delay control circuit.
Figure 2:
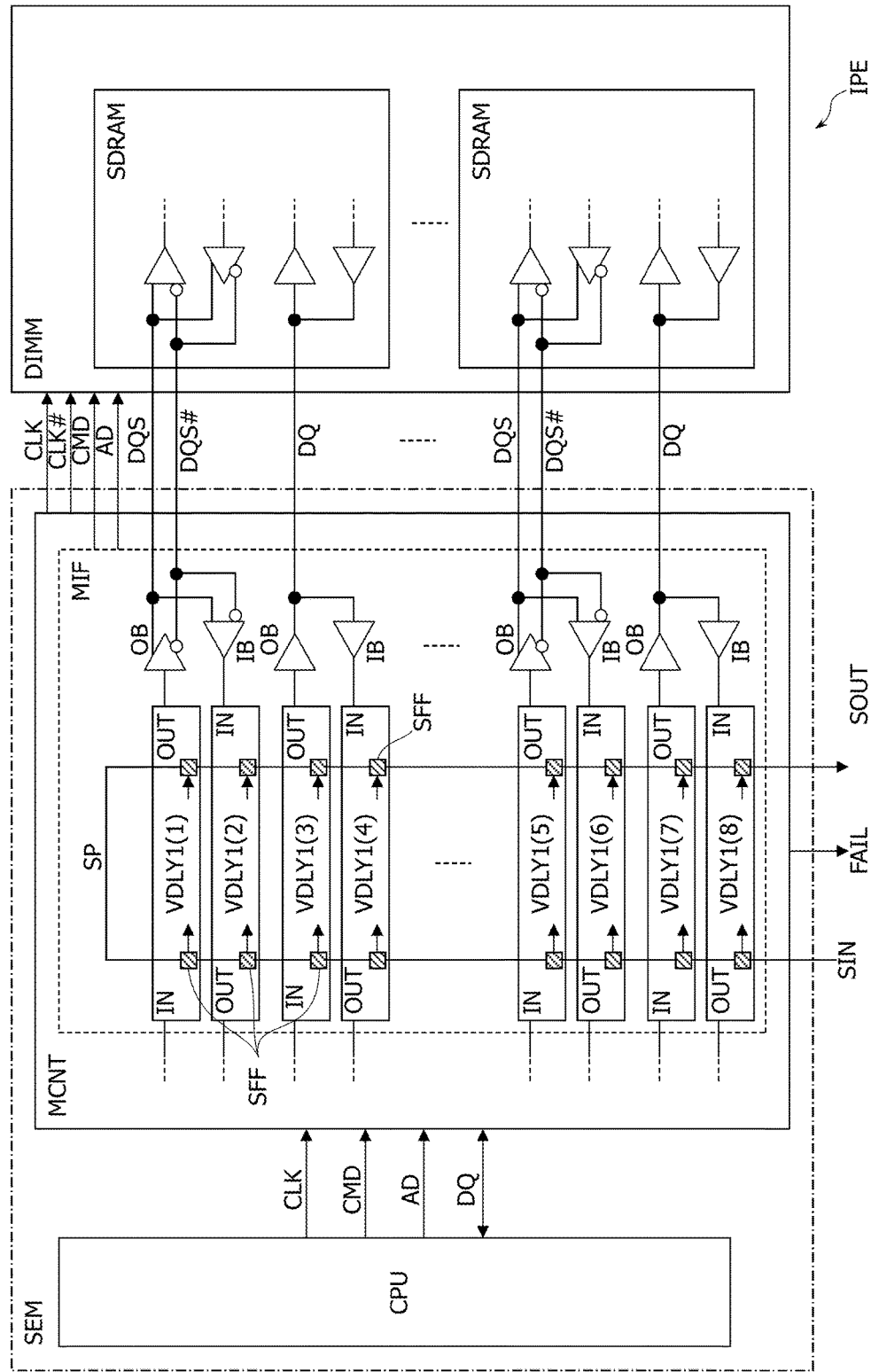
FIG. 2 illustrates an example of information processing equipment including a semiconductor device in which the memory controller in FIG. 1 is mounted.

FIG. 1 illustrates an embodiment of a method of diagnosing a stuck-at fault in a variable delay control circuit and a memory controller that has the variable delay control circuit. A memory controller MCNT in FIG. 1 has a variable delay control circuit VDLY1. The number of variable delay control circuits VDLY1 mounted in the memory controller MCNT is not limited to 1. As illustrated in FIG. 2, a plurality of variable delay control circuits VDLY1 may be mounted.

The variable delay control circuit VDLY1 has test registers T0 and T1, a plurality of delay units U (U0, U1, U2, and U3), and one or more control registers C (C0, C1, C2, and C3). The variable delay control circuit VDLY1 also has a plurality of exclusive logical sum circuits EOR (EOR0, EOR1, and EOR2), a plurality of diagnostic registers R (R0, R1, and R2), and a logical sum circuit OR.

For example, the test registers T0 to T1, control registers C0 to C3, and diagnostic registers R0 to R2 are each a scan flip-flop that has a data input terminal D as well as a scan input terminal and a scan mode terminal (that are not illustrated). Each scan flip-flop latches a logical value received at the data input terminal D in synchronization with a rising edge of a clock RCK while a normal operation mode, during which a semiconductor device SEM (see FIG. 2) in which the memory controller MCNT is mounted is operating as a system, is in progress. The scan flip-flop outputs the latched logical value from a data output terminal Q. The scan flip-flop also latches, in synchronization with a rising edge of the clock RCK, a logical value received at the scan input terminal while a test mode, during which an operational test such as a scan test for the semiconductor device SEM is executed, is in progress, and outputs the latched logical value from the data output terminal Q. While in the test mode, the logical value output from the data output terminal Q is forwarded to the scan input terminal of the adjacent scan flip-flop through a scan path SP (see FIG. 2). The operation of the scan flip-flop while in the normal operation mode or test mode is switched according to the logical value of a scan-mode signal supplied to the scan-mode terminal.

The variable delay control circuit VDLY1 changes an amount by which an output signal OUT has a delay with respect to an input signal IN such as a data signal by changing the number of coupled delay units U that transfer the input signal IN according to a logical value set in the control registers C0 to C2. The output signal OUT is, for example, a data signal created by delaying the input signal IN by using the variable delay control circuit VDLY1. The test registers T0 and T1, exclusive logical sum circuits EOR0 to EOR2, diagnostic registers R0 to R2, and logical sum circuit OR are used while an operational test for the variable delay control circuit VDLY1 (test mode) is in progress.

The test registers T0 and T1, control registers C0 to C3, and diagnostic registers R0 to R2 operate in synchronization with a clock RCK, which is used to set a register. The clock RCK is created by using, for example, a phase locked loop (PLL) circuit (not illustrated) mounted in the semiconductor device SEM in FIG. 2. The frequency of the clock RCK is lower than the frequency of a clock CLK used by a central processing unit (CPU) (see FIG. 2) mounted in the semiconductor device SEM.

When a functional test, in which whether the delay units U function normally is decided, is executed, the test register T0 creates the input signal IN in synchronization with the clock RCK, and the test register T1 holds the logical value of the output signal OUT, which is created by delaying the input signal IN, in synchronization with the clock signal RCK. The logical value held in the test register T1 is compared with an expected value to decide whether the delay units U function normally. An example of the functional test is illustrated in FIGS. 5A to 5D.

While the normal operation mode, during which the semiconductor device SEM in FIG. 2 operates as a system, is in progress, the output terminal Q of the test register T0 is disconnected from an input signal line IN. The input signal IN such as a data signal DQ illustrated in FIG. 2 is supplied to the delay unit U0 through a path separate from a path through which an output from the test register T0 is transmitted. The output signal OUT is supplied to a circuit (not illustrated) that operates while in the normal operation mode.

The delay unit U0 has inverters IV00 and IV01 and a selector SEL0. Similarly, the delay unit U1 has inverters IV10 and IV11 and a selector SEL1, the delay unit U2 has inverters IV20 and IV21 and a selector SEL2, and the delay unit U3 has inverters IV30 and IV31 and a selector SEL3. A pair of inverters IV00 and IV01, a pair of inverters IV10 and IV11, a pair of inverters IV20 and IV21, and a pair of inverters IV30 and IV31 are each an example of the delay circuit. The selectors SEL (SEL0, SEL1, SEL2, and SEL3) are each an example of a switching circuit that selects the number of coupled delay circuits that transmit the input signal IN such as the data signal, according to one of a plurality of control values received from the control registers C. The plurality of control values may be included in control signal. Each selector SEL may be disposed outside the relevant delay unit U.

The inverters IV00, IV10, IV20, IV30 are coupled in series in that order. An output from the inverter IV00 is coupled to one of the inputs of the selector SEL0. Similarly, an output from the inverter IV10 is coupled to one of the inputs of the selector SEL1, an output from the inverter IV20 is coupled to one of the inputs of the selector SEL2, and an output from the inverter IV30 is coupled to one of the inputs of the selector SEL3. The selector SEL3, inverter IV31, selector SEL2, inverter IV21, selector SEL1, inverter IV11, selector SEL0, inverter IV01 are coupled in series in that order. The inverter IV00 receives the input signal IN and the inverter IV01 outputs the output signal OUT.

The selector SEL0 selects an output from the inverter IV11 during a period in which a logical 0 (a first logical value) is output from the control register C0 and selects an output from the inverter IV00 during a period in which a logical 1 (a second logical value that is a value except for the first logical value) is output from the control register C0. The selector SEL1 selects an output from the inverter IV21 during a period in which a logical 0 is output from the control register C1 and selects an output from the inverter IV10 during a period in which a logical 1 is output from the control register C1. The selector SEL2 selects an output from the inverter IV31 during a period in which a logical 0 is output from the control register C2 and selects an output from the inverter IV20 during a period in which a logical 1 is output from the control register C2. The selector SEL3 selects a logical 0 from the control register C3 during a period in which the logical 0 is output and selects an output from the inverter IV30 during a period in which a logical 1 is output from the control register C3. That is, the selectors SEL0 to SEL3 respectively receive a logical value through nodes n0 to n3, after which each selector SEL couples one of its two input terminals to its output terminal according to the received logical value.

The variable delay control circuit VDLY1 then outputs the output signal OUT, which has been created by delaying the input signal IN by using only the delay unit U0, two delay units U0 and U1, three delay units U0 to U2, or all of the four delay units U0 to U3. That is, the variable delay control circuit VDLY1 causes the input signal IN to loop back at one of the delay units U0, U1, U2, and U3 to adjust an amount by which the output signal OUT has a delay with respect to the input signal IN. Each delay unit U may have a resistance-capacitance (CR) time-constant circuit that includes a resistive element R and a capacitive element C, instead of a pair of inverters IV.

The exclusive logical sum circuits EOR0 to EOR2, diagnostic registers R0 to R2, and logical sum circuit OR are mounted in the variable delay control circuit VDLY1 to detect a stuck-at fault in the output nodes n0, n1, n2, and n3 of their corresponding control registers C0, C1, C2, and C3. A control value (logical value) to be set in the output nodes n (n0, n1, n2, and n3) is held in the control registers C (C0, C1, C2, and C3), respectively. The output nodes n0, n1, n2, and n3 are not a single point on the signal lines coupled to the outputs of the control registers C0, C1, C2, and C3 but indicate the whole of the signal lines. The logical values that are output from the control registers C0, C1, C2, and C3 and appear in their corresponding output nodes n0, n1, n2, and n3 are examples of control values that control the operations of the selectors SEL0, SEL1, SEL2, and SEL3. The output node n0 is an example of a control line through which the control value held in the control register C0 is transmitted to the selector SEL0. Similarly, the output node n1 is an example of a control line through which the control value held in the control register C1 is transmitted to the selector SEL1, the output node n2 is an example of a control line through which the control value held in the control register C2 is transmitted to the selector SEL2, and the output node n3 is an example of a control line through which the control value held in the control register C3 is transmitted to the selector SEL3. A combination of the output nodes n0, n1, n2, and n3 is an example of a control line group. In the description below, sometimes the output nodes n0, n1, n2, and n3 will simply be referred to as the nodes n0, n1, n2, and n3.

The node n0 is coupled to one of the inputs of the exclusive logical sum circuit EOR0. The node n1 is coupled in common to the other of the inputs of the exclusive logical sum circuit EOR0 and to one of the inputs of the exclusive logical sum circuit EOR1. The node n2 is coupled in common to the other of the inputs of the exclusive logical sum circuit EOR1 and to one of the inputs of the exclusive logical sum circuit EOR2. The node n3 is coupled the other of the inputs of the exclusive logical sum circuit EOR2. The exclusive logical sum circuit EOR0 calculates the exclusive logical sum of the logical values that appear the nodes n0 and n1 and outputs the calculated value to the diagnostic register R0 and logical sum circuit OR. Similarly, the exclusive logical sum circuit EOR1 calculates the exclusive logical sum of the logical values that appear the nodes n1 and n2 and outputs the calculated value to the diagnostic register R1 and logical sum circuit OR, and the exclusive logical sum circuit EOR2 calculates the exclusive logical sum of the logical values that appear the nodes n2 and n3 and outputs the calculated value to the diagnostic register R2 and logical sum circuit OR.

The diagnostic register R0 holds the logical value output from the exclusive logical sum circuits EOR0. Similarly, the diagnostic register R1 holds the logical value output from the exclusive logical sum circuits EOR1, and the diagnostic register R2 holds the logical value output from the exclusive logical sum circuits EOR2.

Of the nodes n0 to n3, the node n1 (or n2) other than the two nodes n0 and n3 is coupled in common to one of the inputs of the exclusive logical sum circuit EOR0 (or EOR1) and to one of the inputs of the exclusive logical sum circuit EOR1 (or EOR2). Thus, a node n in which a stuck-at fault has occurred can be detected by using the minimum number of exclusive logical sum circuits EOR, as described below with reference to FIG. 4. If the variable delay control circuit VDLY1 has eight delay units U and eight nodes n, the three exclusive logical sum circuits EOR0 to EOR2 illustrated in FIG. 1 may be coupled for each group (node group) constituted by four nodes n.

The logical sum circuit OR calculates the logical sum of the outputs from the exclusive logical sum circuits EOR0 to EOR2 and outputs the calculation result as a fail signal FAIL. As described below with reference to FIG. 4, a fail signal FAIL with logical value 1 indicates that a stuck-at fault has occurred in one of the nodes n0 to n3, and a fail signal FAIL with a logical 0 indicates that a stuck-at fault has not occurred in any of the nodes n0 to n3.

If the nodes n0 to n3 are coupled directly to the inputs of the logical sum circuit OR without the exclusive logical sum circuits EOR0 to EOR2 intervening therebetween, it is difficult to detect a stuck-at fault of a logical 0 that has occurred in one of the nodes n0 to n3 according to the logical value of the fail signal FAIL. However, with the nodes n0 to n3 coupled directly to the inputs of the logical sum circuit OR, it is possible to detect a stuck-at fault of a logical 1 that has occurred in one of the nodes n0 to n3 according to the logical value of the fail signal FAIL. In this case, however, the nodes n0 to n3 become longer than in FIG. 1, increasing loads on the nodes n0 to n3. Since there are variations in the line lengths of the nodes n0 to n3 depending on the position of the logical sum circuit OR, the loads on the nodes n0 to n3 also vary. Therefore, times taken for the control values set in the control registers C0 to C3 to reach the selectors SEL0 to SEL3 are prolonged and varied when compared with FIG. 1. As a result, a time taken until an amount by which the output signal OUT has a delay with respect to the input signal IN is changed is prolonged and the performance of the variable delay control circuit VDLY1 is lowered when compared with the variable delay control circuit VDLY1 in FIG. 1.

As an aid to comprehension, the variable delay control circuit VDLY1 in FIG. 1 has four delay units U. In an actual memory controller MCNT, however, the variable delay control circuit VDLY1 may have three delay units U or five or more delay units U. In this case, the variable delay control circuit VDLY1 has as many control registers C as the number of delay units U, a fewer number of exclusive logical sum circuits EOR than the number of delay units U, and as many diagnostic registers R as the number of exclusive logical sum circuits EOR. An increment at which the amount of delay (delay time at each delay unit U) is adjusted by the variable delay control circuit VDLY1 is shorter than, for example, one cycle of the clock CLK illustrated in FIG. 2.

FIG. 2 illustrates an example of information processing equipment IPE, such as a server, that includes the semiconductor device SEM in which the memory controller MCNT in FIG. 1 is mounted. The semiconductor device SEM includes, for example, an arithmetic processing apparatus, such as a CPU, and the memory controller MCNT. The variable delay control circuits VDLY1 (variable delay control circuit VDLY1 (1) to variable delay control circuit VDLY1 (8)) are mounted in a memory interface MIF in the memory controller MCNT.

The CPU outputs a clock CLK, a command signal CMD, an address signal AD, and a data signal DQ (write data signal) to the memory controller MCNT and receives a data signal DQ (read data signal) from the memory controller MCNT. The command signal CMD, address signal AD, and data signal DQ may be transmitted and received between the CPU and the memory controller MCNT in the form of a packet. The CPU accesses a plurality of synchronous dynamic random-access memories (SDRAMs) coupled to the semiconductor device SEM through the memory controller MCNT. The SDRAMs are mounted in, for example, a dual inline memory module (DIMM). The SDRAM and DIMM are examples of storage units coupled to the semiconductor device SEM.

The memory controller MCNT controls the operation of the DIMM in response to a memory access request that includes a command signal CMD and an address signal AD, the memory access request being output from the CPU, to have the SDRAM execute a read operation, a write operation, or the like. Data strobe signal lines DQS and DQS# and the data signal lines DQ, which are coupled between the semiconductor device SEM and the DIMM, transmit bidirectional signals.

In the example in FIG. 2, variable delay control circuits VDLY1 are provided for each SDRAM in correspondence to a data strobe signal DQS (DQS#) and data signal DQ that are output from the SDRAM. Variable delay control circuits VDLY1 are also provided for each SDRAM in correspondence to data strobe signal DQS (DQS#) and data signal DQ that are received from the SDRAM. Each SDRAM has, for example, eight-bit data terminals DQ. To simplify FIG. 2, however, FIG. 2 illustrates only one bit. When eight-bit data terminals DQ are used, the memory interface MIF has eight variable delay control circuits VDLY1 (3), eight variable delay control circuits VDLY1 (4), eight variable delay control circuits VDLY1 (7), and eight variable delay control circuits VDLY1 (8). The memory interface MIF may have other variable delay control circuits in correspondence to the data strobe signals DQS and DQS#, instead of the variable delay control circuits VDLY1. That is, variable delay control circuits VDLY1 may be provided in correspondence to only the data signal DQ.

The variable delay control circuits VDLY1 (1), VDLY1 (3), VDLY1 (5), and VDLY1 (7) are used to establish a mutual synchronization among the data strobe signal DQS or DQS# and data signal DQ (write data signal) that are output to the relevant SDRAM. That is, the variable delay control circuits VDLY1 (1), VDLY1 (3), VDLY1 (5), and VDLY1 (7) adjust an amount by which the data signal DQ to be written to the relevant SDRAM has a delay with respect to the data strobe signal DQS or DQS# to be output to the SDRAM.

The variable delay control circuits VDLY1 (2), VDLY1 (4), VDLY1 (6), and VDLY1 (8) are used to establish a mutual synchronization among the data strobe signal DQS or DQS# and data signal DQ (read data signal) that are received from the relevant SDRAM. That is, the variable delay control circuits VDLY1 (2), VDLY1 (4), VDLY1 (6), and VDLY1 (8) adjust an amount by which the data signal DQ to be read from the relevant SDRAM is delayed with respect to the data strobe signal DQS or DQS# to be received from the SDRAM.

The memory interface MIF has, for each SDRAM, a plurality of output buffers OB that output the data strobe signal DQS or DQS# and data signal DQ (write data signal) to the SDRAM. The memory interface MIF also has, for each SDRAM, a plurality of input buffers IB that receive the data strobe signal DQS or DQS# and data signal DQ (read data signal) from the SDRAM.

In the memory interface MIF, scan flip-flops SFF, each of which is indicated as a hatched rectangle, are coupled in series through a scan path SP. The scan path SP is a test path that sets test data in the scan flip-flops SFF and reads test results from the scan flip-flops SFF while the test mode is in progress. The scan path SP and the scan flip-flops SFF coupled to the scan path SP are also referred to the scan chain.

When the output terminal of each scan flip-flop SFF is sequentially coupled to the input terminal of the adjacent scan flip-flop SFF by using the scan path SP, the scan flip-flops SFF function as a shift register. The scan flip-flops SFF are used to execute a functional test (scan test) for a logic circuit and the like in the memory controller MCNT. The scan chain may be expanded to the outside of the memory controller MCNT besides being limited to the inside of the memory controller MCNT.

In the scan test, a test apparatus that tests the semiconductor device SEM sequentially sets test data in the scan flip-flops SFF through a scan-in terminal SIN, after which the test apparatus causes the semiconductor device SEM to execute a predetermined operation. The test apparatus then decides whether the semiconductor device SEM is normal or abnormal, according to information items that the test apparatus sequentially receives from a scan-out terminal SOUT, each information item indicating a test result.

In FIG. 2, for each variable delay control circuit VDLY1, one scan flip-flop SFF that outputs a signal to the inside of the variable delay control circuit VDLY1 and one scan flip-flop SFF that receives a signal from the inside of the variable delay control circuit VDLY1 are indicated. In practice, however, each variable delay control circuit VDLY1 has a plurality of scan flip-flops SFF (for example, the test register T0 and control registers C0 to C3 illustrated in FIG. 1) each of which outputs a signal to the inside of the variable delay control circuit VDLY1. Each variable delay control circuit VDLY1 also has a plurality of scan flip-flops SFF (for example, the test register T1 and diagnostic registers R0 to R2 illustrated in FIG. 1) each of which receives a signal from the inside of the variable delay control circuit VDLY1.

In the variable delay control circuits VDLY1 (1) and VDLY1 (5), a signal from which the data strobe signal DQS or DQS#, which is output to the SDRAM, is created is supplied to the input terminal IN. In the variable delay control circuits VDLY1 (2) and VDLY1 (6), the data strobe signal DQS or DQS#, whichever had been output from the SDRAM and has been received at the input buffer IB, is supplied to the input terminal IN.

In the variable delay control circuits VDLY1 (3) and VDLY1 (7), a signal from which the data signal DQ (write data signal), which is output to the SDRAM, is created is supplied to the input terminal IN. In the variable delay control circuits VDLY1 (4) and VDLY1 (8), the data signal DQ (read data signal), which had been output from the SDRAM and has been received at the input buffer IB, is supplied to the input terminal IN.

The memory controller MCNT outputs the clock CLK or CLK#, command signal CMD, and address signal AD to the SDRAM. The command signal CMD is, for example, a low address strobe signal, a column address strobe signal, or a write-enable signal. The memory controller MCNT causes the SDRAM to perform a write operation to write data DQ to the SDRAM or a read operation to read out data DQ from the SDRAM, according to the command signal CMD.

If the SDRAM has data terminals DQ forming a plurality of bits, the data signal lines DQ have mutually different lengths depending on the positions of the input buffers IB and output buffers OB in the semiconductor device SEM and loads on these lines also mutually differ. Therefore, a skew occurs among a plurality of data signals DQ (read data signals) received at the memory interface MIF, so a timing margin for the data strobe signal DQS or DQS# varies for each data signal DQ. Similarly, a skew occurs among a plurality of data signals DQ (write data signals) to be output from the memory interface MIF to the SDRAM, so a timing margin for the data strobe signal DQS or DQS# varies for each data signal DQ.

In the memory controller MCNT illustrated in FIG. 2, the variable delay control circuits VDLY1 are used to adjust delay times, so it is possible to suppress a skew from occurring among a plurality of data signals DQ (write data signals or read data signals). Therefore, the timing margins of a plurality of data signals DQ for the data strobe signal DQS or DQS# can be made the same. The timing margin of the data signal DQ will be described later with reference to FIG. 3.

Figure 3:
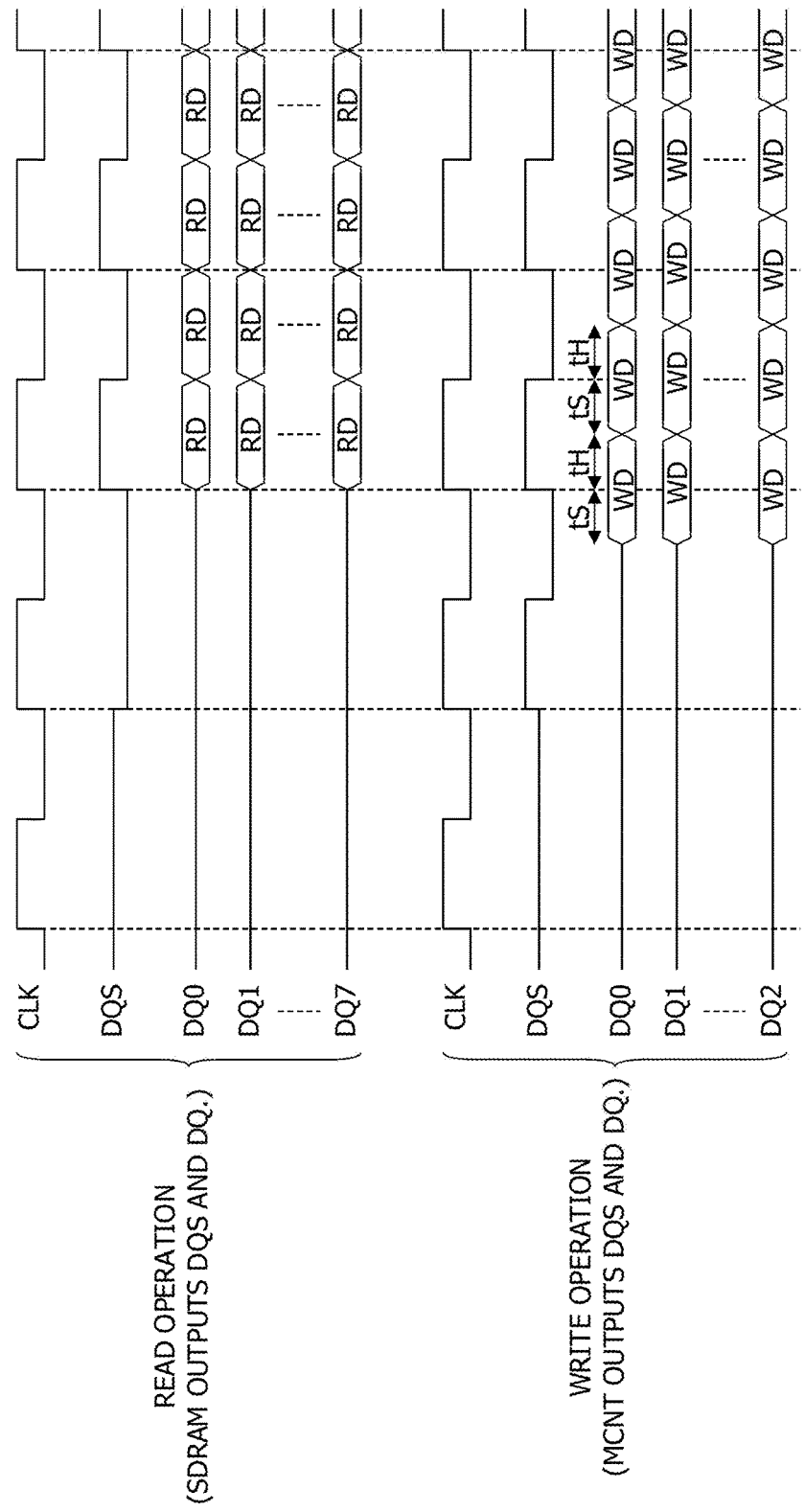
FIG. 3 is an example of timing specifications of the SDRAM in FIG. 2.

FIG. 3 is an example of timing specifications of the SDRAM in FIG. 2. The SDRAM is, for example, a Double-Data-Rate-3 (DDR3) SDRAM.

In a read operation, the SDRAM sets the data strobe signal DQS to a logical 0 in a clock cycle immediately before a clock cycle in which data signals DQ0 to DQ7 (read data signals RD) start to be output. The SDRAM then outputs the data signals DQ0 to DQ7 (read data signals RD) to the memory controller MCNT in synchronization with rising edges and falling edges of the data strobe signal line DQS created in synchronization with the clock CLK. The memory controller MCNT sequentially receives the data signals RD in the read operation, starting from the next clock cycle after the clock cycle in which a logical 0 of the data strobe signal line DQS has been detected.

The delay time adjusted by the variable delay control circuit VDLY1 is shorter than one cycle of the clock CLK, and the delay time, of the input signal IN (see FIG. 1), that is produced by each delay unit U is adequately shorter than one clock CLK. Therefore, by adjusting the delay time with the variable delay control circuit VDLY1 in FIG. 1, a match can be made between a rising edge or falling edge of the data strobe signal DQS and a reception timing at which each bit of the data signals DQ0 to DQ7. That is, it is possible to reduce the skew of the read data signal RD when compared with a case in which the delay time is not adjusted by the variable delay control circuit VDLY1 and thereby to improve the timing margin of the read data signal RD.

In the write operation, the memory controller MCNT starts to create the data strobe signal DQS synchronized with the clock CLK in a clock cycle in which the data signals DQ0 to DQ7 (write data signals WD) start to be output.

Then, the memory controller MCNT sequentially outputs the data signals DQ0 to DQ7 (write data signals WD) to the SDRAM in synchronization with rising edges and falling edges of the data strobe signal DQS.

By adjusting the delay time with the variable delay control circuit VDLY1 in FIG. 1, the setup time tS and hold time tH of the data signals DQ0 to DQ7 for a rising edge or falling edge of the data strobe signal DQS can be made the same. That is, the transient edge of the data strobe signal DQS can be made to coincide with the center of the output period of each bit of the write data signal WD. It is also possible to reduce the skew of the write data signal WD when compared with a case in which the delay time is not adjusted by the variable delay control circuit VDLY1 and thereby to improve the timing margin of the write data signal WD.

The delay time of the read data signal RD with respect to the data strobe signal DQS is adjusted by, for example, the variable delay control circuits VDLY1 (4) and VDLY1 (8) in FIG. 2. However, the delay time of the read data signal RD with respect to the data strobe signal DQS may be adjusted by the variable delay control circuits VDLY1 (2), VDLY1 (4), VDLY1 (6), and VDLY1 (8) in FIG. 2. The delay time of the write data signal WD with respect to the data strobe signal DQS is adjusted by, for example, the variable delay control circuits VDLY1 (3) and VDLY1 (7) in FIG. 2. However, the delay time of the write data signal WD with respect to the data strobe signal DQS may be adjusted by the variable delay control circuits VDLY1 (1), VDLY1 (3), VDLY1 (5), and VDLY1 (7) in FIG. 2.

FIG. 4 illustrates an example of the operation of the variable delay control circuit VDLY1 in FIG. 1. The table on the right side in FIG. 4 indicates an example of a method of diagnosing a stuck-at fault in the variable delay control circuit VDLY1.

A time by which the output signal OUT has a delay with respect to the input signal IN is adjusted by changing a logical value to be set in the nodes n0 to n3 with the setting of the control registers C0 to C3 as illustrated in the table on the left side in FIG. 4. In this case, the node n corresponding to the delay unit U at which the input signal IN loops back is set to a logical 1, and the other nodes n are set to a logical 0. To cause the output signal OUT to have a delay by a time equivalent to, for example, two delay units U (the number of coupled delay units U is 2) with respect to the input signal IN, the node n1 corresponding to the delay unit U1 at which the input signal IN loops back is set to a logical 1, and the other nodes n0, n2, and n3 are set to a logical 0. To cause the output signal OUT to have a delay by a time equivalent to three delay units U (the number of coupled delay units U is 3) with respect to the input signal IN, the node n2 corresponding to the delay unit U2 at which the input signal IN loops back is set to a logical 1, and the other nodes n0, n1, and n3 are set to a logical 0. The number of coupled delay units U is equal to the number of pairs of inverters IV (delay circuits), each pair of inverters IV being included in one delay unit U.

When the output signal OUT is caused to have a delay by a time equivalent to two delay units U with respect to the input signal IN, the input signal IN is not transmitted to the delay units U2 and U3 and the delay units U2 and U3 are not used. When the nodes n coupled to the non-used delay units U (U2 and U3, for example) are set to a logical 0, inputs to the inverters IV with a numeric value ended with 1 (IV21 and IV31, for example) in FIG. 1 can be stuck at a logical 0. Therefore, it is possible to suppress a charge/discharge current from flowing into the inverters IV21 and IV31 according to a change in the logical value of the input signal IN and thereby to suppress the power consumption of the variable delay control circuit VDLY1 from being increased due to the charge/discharge current in the inverters IV21 and IV31.

An optimum delay time to be set in each variable delay control circuit VDLY1 is determined according to results of a test executed after the manufacturing of the semiconductor device SEM. A logical value to be set in the nodes n0 to n3 is determined according to the determined optimum delay time. A logical value to be set in the nodes n0 to n3, for example, is written to a non-volatile programming element mounted in the semiconductor device SEM in the manufacturing process of the semiconductor device SEM. When the semiconductor device SEM is powered on, the logical value is transmitted from the programming element to the control registers C0 to C3. The delay time set in each variable delay control circuit VDLY1 may be finely adjusted according to a change in the power supply voltage of the semiconductor device SEM or a change in its temperature.

To detect a stuck-at fault in the nodes n0 to n3 in the test process of the semiconductor device SEM, all 0s or all 1s are sequentially set in the control registers C0 to C3 as illustrated in the table on the right side in FIG. 4. Due to the settings in the control registers C0 to C3, the nodes n0 to n3 are set to all 0s or all 1s. In the operation, illustrated in FIG. 4, to detect a stuck-at fault, it is assumed that a single stuck-at fault occurs in only one of the nodes n0 to n3 in the variable delay control circuit VDLY1. In FIG. 4, (1) indicates that a stuck-at fault of a logical 1 has occurred and (0) indicates that a stuck-at fault of a logical 0 has occurred.

If there is no stuck-at fault, the exclusive logical sum circuits EOR0 to EOR2 output a logical 0 in both a test pattern with all 0s and a test pattern with all 1s. Therefore, the diagnostic registers R0 to R2 hold a logical 0 and logical sum circuit OR outputs a fail signal FAIL with a logical 0. That is, the fail signal FAIL with a logical 0 output from the logical sum circuit OR indicates that there is no stuck-at fault in the nodes n0 to n3.

If the node n0 includes a stuck-at fault of a logical 1 or logical 0, the exclusive logical sum circuits EOR0, EOR1, and EOR2 respectively output a logical 1, logical 0, and logical 0 and diagnostic registers R0, R1, and R2 respectively hold a logical 1, logical 0, and logical 0. If the node n1 includes a stuck-at fault of a logical 1 or logical 0, the exclusive logical sum circuits EOR0, EOR1, and EOR2 respectively output a logical 1, logical 1, and logical 0 and diagnostic registers R0, R1, and R2 respectively hold a logical 1, logical 1, and logical 0.

If the node n2 includes a stuck-at fault of a logical 1 or logical 0, the exclusive logical sum circuits EOR0, EOR1, and EOR2 respectively output a logical 0, logical 1, and logical 1 and diagnostic registers R0, R1, and R2 respectively hold a logical 0, logical 1, and logical 1. If the node n3 includes a stuck-at fault of a logical 1 or logical 0, the exclusive logical sum circuits EOR0, EOR1, and EOR2 respectively output a logical 0, logical 0, and logical 1 and diagnostic registers R0, R1, and R2 respectively hold a logical 0, logical 0, and logical 1.

If one of the nodes n0 to n3 includes a stuck-at fault of a logical 1 or logical 0, at least one of the exclusive logical sum circuits EOR0 to EOR2 outputs a logical 1, so the logical sum circuit OR outputs a fail signal FAIL with a logical 1. The fail signal FAIL is output directly to the test apparatus and the like through a fail terminal FAIL without passing the scan path SP, as illustrated in FIG. 2.

Therefore, when the test apparatus that tests the semiconductor device SEM receives a fail signal FAIL with a logical 1, the test apparatus can determine whether a stuck-at fault of a logical 1 or logical 0 has occurred in one of the nodes n0 to n3. That is, without reading out the values held in the diagnostic registers R0 to R2 through the scan path SP, the test apparatus can determine whether a stuck-at fault of a logical 1 or logical 0 has occurred in one of the nodes n0 to n3.

If the fail terminal FAIL is at a logical 0, there is no stuck-at fault in the nodes n0 to n3, so an operation to read out the values held in the diagnostic registers R0 to R2 through the scan path SP can be skipped. As a result, a test time can be shortened and the test efficiency can be improved when compared with a case in which the scan path SP is used to determine the presence or absence of a stuck-at fault in the nodes n0 to n3.

The fail signal FAIL is created in common to a plurality of variable delay control circuits VDLY1 as illustrated in FIG. 2. That is, the fail signal FAIL output from the semiconductor device SEM is a signal indicating a logical sum of fail signals FAIL (see FIG. 1) output from a plurality of variable delay control circuits VDLY1. Therefore, even if the semiconductor device SEM has a plurality of variable delay control circuits VDLY1, the semiconductor device SEM can notify the outside of the occurrence of a stuck-at fault in one of the nodes n0 to n3 in the plurality of variable delay control circuits VDLY1, without increasing the number of fail terminals FAIL. The test apparatus can detect the occurrence of a stuck-at fault in one of the nodes n0 to n3 in the plurality of variable delay control circuits VDLY1. Since a stuck-at fault is detected by diagnosing a plurality of variable delay control circuits VDLY1 at one time, a test time can be shortened and thereby a test cost can be reduced when compared with a case in which a plurality of variable delay control circuits VDLY1 are diagnosed one at a time to detect a stuck-at fault.

As illustrated in FIG. 1, the node n1 is coupled in common to one of the inputs of the exclusive logical sum circuits EOR0 and to one of the inputs of the exclusive logical sum circuits EOR1, and the node n2 is coupled in common to the other of the inputs of the exclusive logical sum circuits EOR1 and to one of the inputs of the exclusive logical sum circuits EOR2. Therefore, as illustrated in FIG. 4, a combination of the logical value [R2:R0] held in the diagnostic registers R0 to R2 can be changed according to the node n in which a stuck-at fault has occurred. When the test apparatus detects a stuck-at fault in the nodes n0 to n3 according to the logical value of the fail signal FAIL, the test apparatus can identify the node n in which a stuck-at fault has occurred by using the minimum number of exclusive logical sum circuits EOR according to the logical value [R2:R0].

Now, it will be assumed that, for example, the nodes n0 and n1 are coupled to one exclusive logical sum circuit EOR and the nodes n2 and n3 are coupled to another exclusive logical sum circuit EOR and that two logical values output from the two exclusive logical sum circuits EOR are separately stored in two separate diagnostic registers R. In this case, it is difficult to identify a stuck-at fault generated in the node n0 from the values held in the two diagnostic registers R. That is, it is difficult to identify, from the values held in the two diagnostic registers R, which of the nodes n0 and n1 has a stuck-at fault.

In the variable delay control circuit VDLY1 in FIG. 1, a failure generated in a path through which the input signal IN is transmitted, the failure including a stuck-at fault, can be identified from the logical value of the output signal OUT that is created from the input signal IN supplied to the variable delay control circuit VDLY1. An example of identifying a failure generated in a path through which the input signal IN is transmitted, the failure including a stuck-at fault, will be described below with reference to FIGS. 5A to 5D.

FIGS. 5A to 5D each illustrate an example of a functional test in a case in which the delay units U0 to U3 are used in the variable delay control circuit VDLY1 in FIG. 1. The functional test in FIGS. 5A to 5D is executed by a test apparatus, such as an LSI tester, that tests the semiconductor device SEM. When the output signal OUT is created by delaying the input signal IN by using the delay units U0 to U3, the node n3 is set to a logical 1 and the other nodes n0 to n2 are set to a logical 0 so that the input signal IN loops back at the delay unit U3.

FIG. 5A illustrates a case in which there is no stuck-at fault in the variable delay control circuit VDLY1 and the variable delay control circuit VDLY1 operates normally. The test apparatus sets the input of the test register T0 to a logical 1 before a rising edge of the clock RCK and sets the input to a logical 0 after a next rising edge (detection edge) of the clock RCK ((a) and (b) in FIG. 5A). The test register T0 changes the input signal IN from the logical 0 to a logical 1 in synchronization with a first rising edge of the clock RCK ((c) in FIG. 5A). The input signal IN is transmitted to the delay units U0 to U3 in the variable delay control circuit VDLY1 and loops back at the delay unit U3, after which the input signal IN passes through the delay units U0 to U3 and is output as the output signal OUT ((d) in FIG. 5A). The test apparatus controls the operation of the PLL circuit mounted in the semiconductor device SEM so that the cycle of the clock RCK is set so as to be slightly longer than a time by which the input signal IN is delayed by the delay units U0 to U3. Therefore, the output signal OUT, which has been created by delaying the input signal IN by using the delay units U0 to U3, changes to a logical 1 before the detection edge of the clock RCK. Since the logical value of the output signal OUT latched in the test register T1 in synchronization with the detection edge is the same as the expected value (logical 1), the test apparatus decides that the test has passed.

FIG. 5B illustrates a case in which a stuck-at fault of a logical 1 has occurred in the node n2 in the variable delay control circuit VDLY1 ((e) in FIG. 5B). FIG. 5B is the same as FIG. 5A except the waveform in the node n2 and the waveform of the output signal OUT. When a stuck-at fault of a logical 1 occurs in the node n2, the input signal IN is caused to loop back at the delay unit U2, after which the input signal IN passes through the delay units U0 to U2 without passing through the delay unit U3 and is output as the output signal OUT. Therefore, a timing at which the logical value of the output signal OUT changes from a logical 0 to a logical 1 is earlier than in FIG. 5A ((f) in FIG. 5B). However, since the output signal OUT changes to a logical 1 before the detection edge of the clock RCK as in FIG. 5A, the test passes. That is, a stuck-at fault of a logical 1 in the node n2 is not detected in the functional test. However, the method illustrated in FIG. 4 can detect a stuck-at fault of a logical 1 or a logical 0 in the nodes n0 to n3, including the node n2.

FIGS. 5C and 5D illustrate a method of diagnosing a stuck-at fault in the variable delay control circuit VDLY1 by using a functional test. When a stuck-at fault is detected by using the functional test, the number of coupled delay units U is set to, for example, the maximum, and the input signal IN is transmitted to all delay units U0 to U3 and is then output as the output signal OUT.

FIG. 5C illustrates a case in which a stuck-at fault of a logical 1 has occurred at the output of the inverter IV31 in the delay unit U3 in the variable delay control circuit VDLY1. FIG. 5C is the same as FIG. 5A except the waveform of the output signal OUT. When a stuck-at fault of a logical 1 occurs at the output of the inverter IV31, the output signal OUT is stuck at a logical 0. Therefore, since the logical value of the output signal OUT differs from the expected value (logical 1), the test apparatus decides that the test has failed ((g) in FIG. 5C). That is, a stuck-at fault of a logical 1 that has occurred at the output of the inverter IV31 can be detected by using the functional test. A stuck-at fault of a logical 1 that has occurred at the outputs of the inverters IV00 and IV20, a stuck-at fault of a logical 0 that has occurred at the outputs of the inverters IV10 and IV30, a stuck-at fault of a logical 1 that has occurred at the outputs of the selectors SEL0 and SEL2, and the like can also be detected as in FIG. 5C.

FIG. 5D illustrates a case in which a stuck-at fault of a logical 0 has occurred at the output of the inverter IV31 in the delay unit U3 in the variable delay control circuit VDLY1. In FIG. 5D, the test apparatus sets the input of the test register T0 to a logical 0 before a rising edge of the clock RCK and sets the input to a logical 1 after a next rising edge (detection edge) of the clock RCK ((h) and (i) in FIG. 5D). When a stuck-at fault of a logical 0 occurs at the output of the inverter IV31, the output signal OUT is stuck at a logical 1. Therefore, since the logical value of the output signal OUT differs from the expected value (logical 0), the test apparatus detects that the test has failed ((j) in FIG. 5D). That is, a stuck-at fault of a logical 0 that has occurred at the output of the inverter IV31 can be detected by using the functional test.

A stuck-at fault of a logical 0 that has occurred at the outputs of the inverters IV00 and IV20, a stuck-at fault of a logical 1 that has occurred at the outputs of the inverters IV10 and IV30, a stuck-at fault of a logical 0 that has occurred at the outputs of the selectors SEL0 and SEL2, and the like can also be detected as in FIG. 5D. If the variable delay control circuit VDLY1 is free from a stuck-at fault and the like and operates normally, when the logical value of the input signal IN changes from a logical 1 to a logical 0, the logical value of the output signal OUT changes from a logical 1 to a logical 0 before the detection edge. Therefore, when the variable delay control circuit VDLY1 operates normally, the output signal OUT has a waveform obtained by reversing the waveform of the output signal OUT illustrated in FIG. 5A. In FIG. 5D, if the variable delay control circuit VDLY1 is free from a stuck-at fault, the logical value of the output signal OUT changes to a logical 0, which is the expected value, before the detection edge, so the test passes.

As described above, in the variable delay control circuit VDLY1, a stuck-at fault in a path (formed by coupling the inputs and outputs of the inverters IV and the inputs and outputs of the selectors SEL) through which the input signal IN is transmitted can also be detected by the functional test for the variable delay control circuit VDLY1.

FIG. 6 illustrates an example of an operational test for the variable delay control circuit VDLY1 in FIG. 1. Processing illustrated in FIG. 6 is executed by a test apparatus, such as an LSI tester, that tests the semiconductor device SEM; to execute the processing, the test apparatus executes test programs. An operation in steps S10 to S20 corresponds to the operation, illustrated in FIG. 4, to detect a stuck-at fault. A stuck-at fault is also detected by using a functional test in step S24. That is, FIG. 6 illustrates an example of a method of diagnosing a stuck-at fault in the variable delay control circuit VDLY1.

First, the test apparatus sets a logical 0 in all control registers C0 to C3 in the variable delay control circuit VDLY1 in step S10. In step S12, the test apparatus decides whether the fail signal FAIL is a logical 1. If the fail signal FAIL is a logical 1, the test apparatus determines that a stuck-at fault of a logical 1 has occurred in one of the nodes n0 to n3 and proceeds to step S14. If the fail signal FAIL is a logical 0, the test apparatus determines that a stuck-at fault of a logical 1 has not occurred in any of the nodes n0 to n3 and proceeds to step S16.

In step S14, the test apparatus reads out the value [R2:R0] (see FIG. 4) held in the diagnostic registers R0 to R2 through the scan path SP and identifies a node n in which a stuck-at fault of a logical 1 has occurred from the read-out value [R2:R0]. After having executed step S14, the test apparatus proceeds to step S22.

In step S16, the test apparatus sets a logical 1 in all control registers C0 to C3 in the variable delay control circuit VDLY1. In step S18, the test apparatus decides whether the fail signal FAIL is a logical 1. If the fail signal FAIL is a logical 1, the test apparatus determines that a stuck-at fault of a logical 0 has occurred in one of the nodes n0 to n3 and proceeds to step S20. If the fail signal FAIL is a logical 0, the test apparatus determines that a stuck-at fault of a logical 0 has not occurred in any of the nodes n0 to n3 and proceeds to step S24.

As described above, the test apparatus can determine from the fail signal FAIL that a stuck-at fault of a logical 1 or logical 0 has not occurred in any of the nodes n0 to n3, without reading out the values held in the diagnostic registers R0 to R2 through the scan path SP. As a result, a time taken to test the semiconductor device SEM can be shortened and the test efficiency can be improved when compared with a case in which the value held in the diagnostic registers R0 to R2 is used to determine that a stuck-at fault has not occurred in any of the nodes n0 to n3. Thus, a cost involved in the test of the semiconductor device SEM can be reduced.

In step S20, the test apparatus reads out the value [R2:R0] (see FIG. 4) held in the diagnostic registers R0 to R2 through the scan path SP and identifies a node n in which a stuck-at fault of a logical 0 has occurred from the read-out value [R2:R0].

In step S22, the test apparatus determines whether the delay unit U corresponding to the node n in which a stuck-at fault has occurred is used in the semiconductor device SEM, which operates as a system in the information processing equipment IPE illustrated in FIG. 2. If the node n is not used in the semiconductor device SEM, the test apparatus proceeds to step S24. That is, if the paired inverters IV (delay circuit) included in the delay unit U corresponding to the node n in which a stuck-at fault has occurred are not used according to the operational specifications of the semiconductor device SEM, the test apparatus proceeds to step S24.

It will be assumed here that, for example, the semiconductor device SEM that operates as a system in the information processing equipment IPE uses the delay units U0 to U2 in the variable delay control circuit VDLY1 to switch the delay time among three settings and does not use the delay unit U3. In this case, the input signal IN is not transmitted to the delay unit U3, so even if there is a stuck-at fault in the node n3 corresponding to the delay unit U3, the variable delay control circuit VDLY1 operates normally. Therefore, if there is no current failure due to the stuck-at fault, the semiconductor device SEM can be handled as a non-defective product. A current failure is detected in a current test, which is executed by the test apparatus before the operational test in FIG. 6 is executed. This makes it possible to relieve a semiconductor device SEM that has been determined to be a defective product due to a stuck-at fault. Therefore, a yield that indicates a ratio of non-defective semiconductor devices SEM can be improved when compared with a case in which semiconductor devices SEM determined to be defective are not relieved.

If the test apparatus decides in step S22 that the delay unit U corresponding to the node n in which a stuck-at fault has occurred is used in the semiconductor device SEM, which operates as a system in the information processing equipment IPE illustrated in FIG. 2, the test apparatus determines the semiconductor device SEM as a defective product and terminates the operation. That is, if the test apparatus detects a stuck-at fault in one of the nodes n according to the logical value of the fail signal FAIL, the test apparatus can determine whether the semiconductor device SEM is defective without executing the functional test for the delay units U0 to U3 in step S24. Accordingly, the semiconductor device SEM can be tested in a shorter time than before and the test efficiency can be made higher than before.

In step S24, the test apparatus executes the functional test illustrated in FIGS. 5A to 5D. For example, the functional test is executed in such a way that the nodes n0 to n3 are set to a logical 1 one at a time to change the number of delay units U to be used. In this case, the cycle of the clock RCK is set to match a time by which the output signal OUT has a delay with respect to the input signal IN. As described above with reference to FIGS. 5A to 5D, a stuck-at fault in a path (formed by coupling the inputs and outputs of the inverters IV and the inputs and outputs of the selectors SEL) through which the input signal IN is transmitted can be detected by the functional test in step S24.

In step S26, the test apparatus decides whether the functional test has passed. If the functional test has passed, the test apparatus determines the semiconductor device SEM is a non-defective product. If the functional test has failed, the test apparatus determines that the semiconductor device SEM is a defective product and terminates the operational test.

Figure 7:
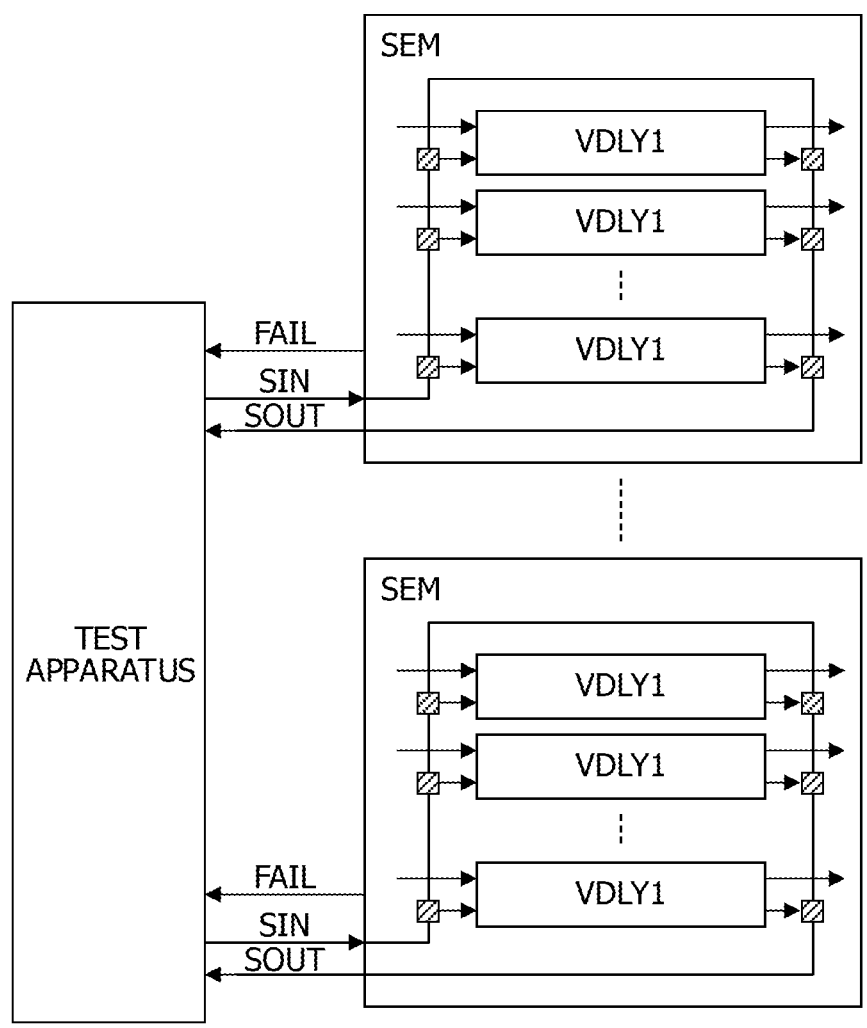
FIG. 7 illustrates an example of a test environment in which the functional tests in FIGS. 5A to 5D are executed.

FIG. 7 illustrates an example of a test environment in which the operational test in FIGS. 5A to 5D is executed. For example, a test apparatus such as an LSI tester concurrently executes operational tests for variable delay control circuits VDLY1 mounted in a plurality of semiconductor devices SEM. The number of variable delay control circuits VDLY1 that the LSI tester concurrently tests is determined depending on the number of terminals of the LSI tester.

In the embodiment illustrated in FIGS. 1 to 7, by using a test pattern with all 0s and a test pattern with all 1s, it is possible to determine whether a stuck-at fault has occurred in one of the nodes n0 to n3, without reading out a value held in the diagnostic registers R0 to R2 through the scan path SP. As a result, it is possible to determine the presence or absence of a stuck-at fault in the nodes n0 to n3 in a shorter time and the test efficiency can be improved when compared with a case in which the scan path SP is used to read out the value held in diagnostic registers R0 to R2 and the presence or absence of a stuck-at fault is then determined. That is, the presence or absence of a stuck-at fault in the variable delay control circuit VDLY1 can be determined in a shorter test time than before.

If the test apparatus detects a stuck-at fault in one of the nodes n according to the logical value of the fail signal FAIL, the test apparatus can determine whether the semiconductor device SEM is defective without executing the functional test for the delay units U0 to U3. Therefore, the efficiency of the test for the semiconductor device SEM can be made higher than before. When the test apparatus that tests the semiconductor device SEM detects a stuck-at fault according to the logical value of the fail signal FAIL, the test apparatus can identify the node n in which the stuck-at fault has occurred by reading out the value [R2:R0] held in the diagnostic registers R2 to R0 through the scan path SP.

If the delay unit U coupled to the node n in which a stuck-at fault has been detected according to the logical value of the fail signal FAIL is not used according to the operational specifications of the semiconductor device SEM, the test apparatus handles the semiconductor device SEM as a non-defective product and executes the functional test for the delay units U0 to U3. This makes it possible to relieve a semiconductor device SEM that has been determined to be a defective product due to a stuck-at fault. Therefore, the yield of semiconductor devices SEM can be improved when compared with a case in which semiconductor devices SEM determined to be defective are not relieved.

The node n1 (or n2), which is one of the nodes n0 to n3 except two nodes n0 and n3, is coupled in common to one of the inputs of the exclusive logical sum circuit EOR0 (or EOR1) and to one of the inputs of the exclusive logical sum circuit EOR1 (or EOR2). In this structure, the node n in which a stuck-at fault has occurred can be detected by using the minimum number of exclusive logical sum circuits EOR.

Figure 8:
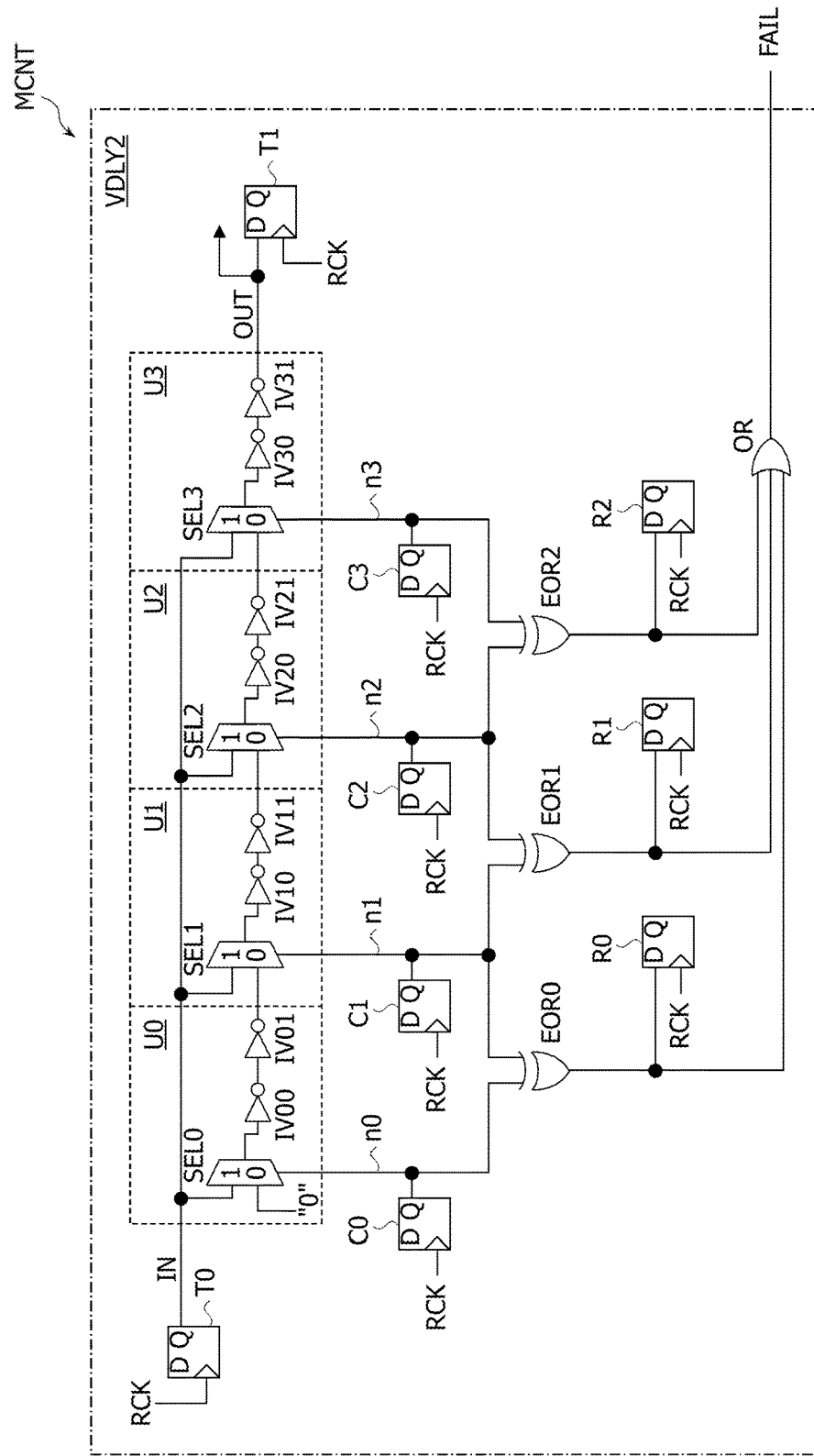
FIG. 8 illustrates another embodiment of a method of diagnosing a stuck-at fault in a variable delay control circuit and a memory controller that has the variable delay control circuit.

FIG. 8 illustrates another embodiment of a method of diagnosing a stuck-at fault in a variable delay control circuit and a memory controller that has the variable delay control circuit. The same or similar elements as or to those illustrated in FIG. 1 are assigned the same symbols and detailed descriptions of these elements will be omitted. The memory controller MCNT in FIG. 8 has a variable delay control circuit VDLY2. The memory controller MCNT has the same structure as illustrated in FIG. 2 except that the memory controller MCNT has the variable delay control circuit VDLY2 instead of the variable delay control circuit VDLY1. Specifically, the memory controller MCNT is mounted in the semiconductor device SEM together with the CPU and is coupled to the DIMM to control the operation of the DIMM.

The variable delay control circuit VDLY2 is the same as the variable delay control circuit VDLY1 illustrated in FIG. 1 except that the delay units U (U0, U1, U2, and U3) have a different structure from the delay units U in FIG. 1. That is, the variable delay control circuit VDLY2 has test registers T0 and T1, delay units U0 to U3, control registers C0 to C3, exclusive logical sum circuits EOR0 to EOR2, diagnostic registers R0 to R2, and a logical sum circuit OR, as in FIG. 1.

Each delay unit U has pairs of inverters IV (IV00, IV01, and so on) and selectors SEL (SEL0 and so on) as in each delay unit U in FIG. 1. In the variable delay control circuit VDLY2, however, a connection between a pair of inverters IV and a selector SEL and a connection between delay units U differ from those in the delay units U in FIG. 1.

The delay unit U0 has a selector SEL0 that selects an input signal IN or a logical 0 according to a logical value that appears in a node n0, and also has inverters IV00 and IV01 coupled in series with the output of the selector SEL0. The delay unit U1 has a selector SEL1 that selects the input signal IN or the output of the inverter IV01 according to a logical value that appears in a node n1, and also has inverters IV10 and IV11 coupled in series with the output of the selector SEL1. The delay unit U2 has a selector SEL2 that selects the input signal IN or the output of the inverter IV11 according to a logical value that appears in a node n2, and also has inverters IV20 and IV21 coupled in series with the output of the selector SEL2. The delay unit U3 has a selector SEL3 that selects the input signal IN or the output of the inverter IV21 according to a logical value that appears in a node n3, and also has inverters IV30 and IV31 coupled in series with the output of the selector SEL3. The output of the inverter IV31 is coupled to an output terminal OUT.

The variable delay control circuit VDLY2 changes an amount by which an output signal OUT has a delay with respect to an input signal IN by changing the number of coupled delay units U that transfer the input signal IN according to the logical value set in the control registers C0 to C2, as in the variable delay control circuit VDLY1 illustrated in FIG. 1. In the variable delay control circuit VDLY2, however, only the delay unit U3 outputs a signal created by delaying the input signal IN, such as a data signal, as the output signal OUT, the input signal IN being delayed by using two delay units U2 and U3, three delay units U1 to U3, or four delay units U0 to U3. A relationship between the numbers of delay units U to be used (number of connections) and logical values to be set in the nodes n0 to n3 is indicated in FIG. 9.

The variable delay control circuit VDLY2 may have three delay units U or five or more delay units U. In this case, the variable delay control circuit VDLY2 has as many control registers C as the number of delay units U, a fewer number of exclusive logical sum circuits EOR than the number of delay units U, and as many diagnostic registers R as the number of exclusive logical sum circuits EOR.

FIG. 9 illustrates an example of the operation of the variable delay control circuit VDLY2 in FIG. 8. An operation to detect a stuck-at fault in the nodes n0 to n3 (operation indicated in the table on the right side in FIG. 9) is the same as the operation indicated in the table on the right side in FIG. 4.

A time by which the output signal OUT has a delay with respect to the input signal IN is adjusted by changing a logical value to be set in the nodes n0 to n3 with the setting of the control registers C0 to C3 as illustrated in the table on the left side in FIG. 9. In the example in FIG. 9, a node n that is coupled to a selector SEL that selects the input signal IN and outputs it to the next inverter IV is set to a logical 1, and the other nodes n are set to a logical 0. For example, to cause the output signal OUT to have a delay by a time equivalent to two delay units U with respect to the input signal IN, the node n2 corresponding to the delay unit U2 is set to a logical 1, and the other nodes n0, n1, and n3 are set to a logical 0. To cause the output signal OUT to have a delay by a time equivalent to three delay units U with respect to the input signal IN, the node n1 corresponding to the delay unit U1 is set to a logical 1, and the other nodes n0, n2, and n3 are set to a logical 0.

When a logical 0 is set in a node n coupled to a delay unit U to which the input signal IN is not transmitted (that is, delay unit U that is not used according to the operational specifications), it is possible to suppress a charge/discharge current from flowing into the inverters IV in the non-used delay unit U, as described above with reference to FIG. 4. As with the variable delay control circuit VDLY1 illustrated in FIG. 1, an optimum delay time to be set in the variable delay control circuit VDLY2 is determined according to results of a test executed after the manufacturing of the semiconductor device SEM, after which a logical value to be set in the nodes n0 to n3 is determined according to the determined optimum delay time. An example of a functional test for the variable delay control circuit VDLY2 is the same as in FIGS.

5A to 5D except that a logical value to be set in the nodes n0 to n3 differs. An example of an operational test for the variable delay control circuit VDLY2 is the same as in FIG. 6.

In the embodiment illustrated in FIGS. 8 and 9 as well, the same effect as in the embodiment illustrated in FIGS. 1 to 7 can be obtained. That is, the presence or absence of a stuck-at fault in the variable delay control circuit VDLY2 can be determined in a shorter time than before. If a stuck-at fault is detected, a node n in which the stuck-at fault has occurred can be identified by reading out the value [R2:R0] held in the diagnostic registers R2 to R0 through the scan path SP. In this case, the node n in which a stuck-at fault has occurred can be detected by using the minimum number of exclusive logical sum circuits EOR.

It is possible to determine whether the semiconductor device SEM is defective due to a stuck-at fault in one of the nodes n without executing the functional test for the delay units U0 to U3. Therefore, the efficiency of the test for the semiconductor device SEM can be made higher than before. If the delay unit U coupled to the node n in which a stuck-at fault has been detected is not used according to the operational specifications of the semiconductor device SEM, it is possible to relieve the semiconductor device SEM that has been determined to be defective due to the stuck-at fault. Therefore, the yield of semiconductor devices SEM can be improved.

The above detailed descriptions will clarify features and advantages of the embodiments. This intends that the range of claims extends to features and advantages, as described above, of the embodiments without departing from the spirit and scope of rights of the claims. Persons having normal knowledge in the technical field will easily devise all possible improvements and modifications. Therefore, there is no intention to limit the range of embodiments having inventiveness to the above descriptions. It is also possible for embodiments to be based on appropriate improvements and equivalents included in the range disclosed in the embodiments.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A method of diagnosing a variable delay control circuit, comprising:
    setting a control signal with a first logical value in a control register provided in the variable delay control circuit including (a) a plurality of delay circuits configured to delay transmission of a data signal, (b) a plurality of switching circuits that select a number of delay circuits to be coupled to a transmission path of the data signal in accordance with the control signal transmitted through a plurality of control lines, (c) a plurality of exclusive logical sum circuits, each of which calculates an exclusive logical sum of logical values that appears in two control lines of the plurality of control lines, (d) a plurality of diagnostic registers, each of which stores a logical value output from one of the plurality of exclusive logical sum circuits, and (e) a logical sum circuit that calculates a logical sum of logical values output from the plurality of exclusive logical sum circuits;
    detecting a first stuck-at fault that is a value except for the first logical value, the first stuck-at fault having occurred in one of the plurality of control lines, in accordance with a result of a comparison between a logical value output from the logical sum circuit and an expected value of the logical value;
    setting a second logical value that is inverse logic of the first logical value in the control register; and
    detecting a second stuck-at fault having occurred in one of the plurality of control lines, in accordance with a result of a comparison between a logical value output from the logical sum circuit and an expected value of the logical value.

2. The method according to claim 1, further comprising:
    reading a logical value held in the plurality of diagnostic registers when a stuck-at fault of the second logical value, the stuck-at fault having occurred in one of the plurality of control lines, is detected;
    identifying a control line in which the stuck-at fault of the second logical value has occurred from the plurality of control lines, in accordance with a logical value held in the plurality of diagnostic registers;
    reading a logical value held in the plurality of diagnostic registers when a stuck-at fault of the first logical value, the stuck-at fault having occurred in one of the plurality of control lines, is detected; and
    identifying a control line in which the stuck-at fault of the first logical value has occurred from the plurality of control lines, in accordance with the logical value held in the plurality of diagnostic registers.

3. The method according to claim 2, further comprising reading the logical value held in the plurality of diagnostic registers through a scan chain in which the plurality of diagnostic registers are coupled in series.

4. The method according to claim 1, further comprising:
    inputting a data signal to the variable delay control circuit and transmitting the data signal through a data path that includes the plurality of delay circuits if occurrence of a stuck-at fault is not detected in any of the plurality of control lines in accordance with the result of the comparison between the expected value and the logical value output from the logical sum circuit; and
    detecting a stuck-at fault that has occurred in the data path if a data signal output from the variable delay control circuit differs from an expected value.

5. The method according to claim 2, further comprising:
    inputting a data signal to the variable delay control circuit when a switching circuit coupled to a control line in which a stuck-at fault has been detected is provided in correspondence to a delay circuit that is not used in accordance with an operational specification of a semiconductor device in which the variable delay control circuit is mounted, the data signal being transmitted through a data path that includes the plurality of delay circuits except the delay circuit that is not used; and
    detecting a stuck-at fault that has occurred in the data path if a data signal output from the variable delay control circuit differs from an expected value.

6. The method according to claim 1, wherein:
    the plurality of control lines are classified into at least one control line group that includes three or more control lines; and two control lines in each control line group are coupled to inputs of one of the plurality of exclusive logical sum circuits, and each of the control lines except the two control lines is coupled in common to inputs of a pair of exclusive logical sum circuits of the plurality of exclusive logical sum circuits.

7. A memory controller coupled to a storage device to which a data signal is transmitted, the memory controller comprising:
   a variable delay control circuit including:
      a plurality of delay circuits configured to delay transmission of a data signal,
      a switching circuit that selects a number of delay circuits to be coupled to a transmission path of the data signal, in accordance with a control signal transmitted through a plurality of control lines,
      a control register that holds the control signal to be set in the plurality of control lines,
      a plurality of exclusive logical sum circuits, each of which calculates an exclusive logical sum of logical values that appears in two control lines of the plurality of control lines,
      a plurality of diagnostic registers, each of which stores a logical value output from one of the plurality of exclusive logical sum circuits, and
      a logical sum circuit that calculates a logical sum of logical values output from the plurality of exclusive logical sum circuits, the variable delay control circuit changes an amount by which the data signal is delayed in accordance with the number of delay circuits to be coupled.

* * * * *